(12) United States Patent
Xie et al.

(10) Patent No.: US 11,419,223 B2
(45) Date of Patent: Aug. 16, 2022

(54) TOUCH DISPLAY MODULE

(71) Applicant: TPK Touch Systems (Xiamen) Inc., Fujian (CN)

(72) Inventors: Yan Jun Xie, Xiamen (CN); Qing Wen Hong, Xiamen (CN); Jun Ping Yang, Longhai (CN); Qi Jun Zheng, Fujian (CN); Jun Jie Zheng, Quanzhou (CN); Ming Chuan Lin, Taichung (TW); Kuo Hsin Wang, Nantou County (TW); Sheh Jung Lai, Taichung (TW); Yu Ling Chen, Taichung (TW)

(73) Assignee: TPK Touch Systems (Xiamen) Inc., Xiamen (CN)

(*) Notice: Subject to any disclaimer, the term of this patent is extended or adjusted under 35 U.S.C. 154(b) by 42 days.

(21) Appl. No.: 17/078,268

(22) Filed: Oct. 23, 2020

(65) Prior Publication Data

US 2021/0410301 A1 Dec. 30, 2021

(30) Foreign Application Priority Data

Jun. 29, 2020 (CN) .......................... 202010607993.4

(51) Int. Cl.
*H05K 5/00* (2006.01)
*H01L 23/04* (2006.01)
*G06F 3/041* (2006.01)
*H01L 27/12* (2006.01)
*F21V 8/00* (2006.01)

(52) U.S. Cl.
CPC ........... *H05K 5/0017* (2013.01); *G06F 3/041* (2013.01); *H01L 23/04* (2013.01); *G02B 6/0081* (2013.01); *H01L 27/1214* (2013.01)

(58) Field of Classification Search
CPC ....... G02B 6/0081; G06F 3/041; H01L 23/04; H01L 27/1214; H05K 5/0017
See application file for complete search history.

(56) References Cited

U.S. PATENT DOCUMENTS

2013/0328051 A1* 12/2013 Franklin ................ H05K 1/028
361/679.01
2016/0357079 A1 12/2016 Chen et al.

FOREIGN PATENT DOCUMENTS

TW I557609 B 11/2016
TW I573061 B 3/2017

* cited by examiner

*Primary Examiner* — Afroza Chowdhury
(74) *Attorney, Agent, or Firm* — Cooper Legal Group, LLC

(57) ABSTRACT

A touch display module has plural sensors and includes an integrated frame, a backlight module, a thin film transistor substrate, a color filter, and a polarizer. The integrated frame has a bottom plate portion and a side plate portion, and the side plate portion stands on the bottom plate portion. The backlight module is disposed on the bottom plate portion. The thin film transistor substrate is disposed on the backlight module. The color filter is disposed on the thin film transistor substrate. The polarizer is disposed on the color filter. One surface of the polarizer is an outer surface of the touch display module. The thin film transistor substrate and/or the color filter is connected to the side plate portion of the integrated frame. Therefore, by using the integrated frame to integrate required components into one mechanical part, the touch display module has thinner thickness and lighter weight.

20 Claims, 7 Drawing Sheets

TOUCH DISPLAY MODULE

RELATED APPLICATIONS

This application claims priority to China Application Serial Number 202010607993.4, filed on Jun. 29, 2020, which is incorporated herein by reference.

BACKGROUND

Field of Disclosure

The present disclosure relates to a touch element. More particularly, the present disclosure relates to a touch display module.

Description of Related Art

In recent years, with the development of touch technologies, thickness of touch display modules has become smaller. The current touch module mainly includes a back mechanism, a backlight module, a touch module, and a cover glass, in which the backlight module includes multiple elements, such as an iron shell, a light source, and optical films. Moreover, the back mechanism is combined with the iron shell of the backlight module, and the cover glass is disposed on the back mechanism. However, such structure increases the overall weigh and thickness of the touch module.

SUMMARY

In order to solve the abovementioned problem of heavy and thick touch display modules and to overcome the deficiencies described in the prior art, an object of the present disclosure is to provide a touch display module with lighter weight, simpler assembly, and thinner thickness.

According to the aforementioned object, a touch display module is provided. The touch display module includes a plurality of sensors. The touch display module further includes an integrated frame, a backlight module, a thin film transistor substrate, a color filter, and a polarizer. The integrated frame has a bottom plate portion and a side plate portion, in which the side plate portion stands on the bottom plate portion. The backlight module is disposed on the bottom plate portion. The color filter is disposed on the thin film transistor substrate. The polarizer is disposed on the color filter, in which a surface of the polarizer is an outer surface of the touch display module. At least one of the thin film transistor substrate or the color filter is connected to the side plate portion of the integrated frame.

According to an embodiment of the present disclosure, the backlight module is located in a space which is surrounded by the side plate portion, and the thin film transistor substrate, the color filter, and the polarizer are carried on a top surface of the side plate portion.

According to an embodiment of the present disclosure, the backlight module and the thin film transistor substrate are located in a space which is surrounded by the side plate portion, and the color filter and the polarizer are located on a top surface of the side plate portion.

According to an embodiment of the present disclosure, the side plate portion of the integrated frame has a first step portion and a second step portion, wherein the second step portion is higher than the first step portion. The backlight module is located in a space which is surrounded by the first step portion. The thin film transistor substrate, the color filter, and the polarizer are carried on a top surface of the first step portion and are located in a space which is surrounded by the second step portion.

According to an embodiment of the present disclosure, outer side edges of the thin film transistor substrate, the color filter, and the polarizer are connected to an inner sidewall of the second step portion by a filling adhesive.

According to an embodiment of the present disclosure, outer side edges of the thin film transistor substrate and the color filter are set with a ring-shaped engaging member, and the ring-shaped engaging member is engaged with an engaging mechanism which is disposed on an inner sidewall of the second step portion. An outer side edge of the polarizer is directly abutted against the inner sidewall of the second step portion.

According to an embodiment of the present disclosure, the side plate portion of the integrated frame has a first step portion and a second step portion, wherein the second step portion is higher than the first step portion. The backlight module and the thin film transistor substrate are located in a space which is surrounded by the first step portion. The color filter and the polarizer are carried on a top surface of the first step portion and are located in a space which is surrounded by the second step portion.

According to an embodiment of the present disclosure, the touch display module further includes a black matrix layer, and the black matrix layer is disposed between the polarizer and the color filter, between the color filter and the thin film transistor substrate, or on a bottom surface of the thin film transistor substrate.

According to an embodiment of the present disclosure, the bottom plate portion of the integrated frame has a recessed portion, and a buffer is disposed in the recessed portion.

According to an embodiment of the present disclosure, the surface of the polarizer is a hardened surface.

According to an embodiment of the present disclosure, the sensors are disposed on an upper surface or a bottom surface of the color filter, or disposed on an upper surface or a bottom surface of the thin film transistor substrate, or disposed on a bottom surface of the polarizer.

It can be seen from the abovementioned embodiments of the present disclosure, the touch display module of the present disclosure mainly uses the integrated frame to integrate the backlight module, thin film transistor substrate, color filter, and polarizer into one single mechanical component, so that the touch display module of the present disclosure does not need a cover glass which is used by a conventional touch display module. Moreover, the backlight module in the touch display module of the present disclosure also does not need to use an iron shell, thereby reducing the overall weight and thickness of the touch display module.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
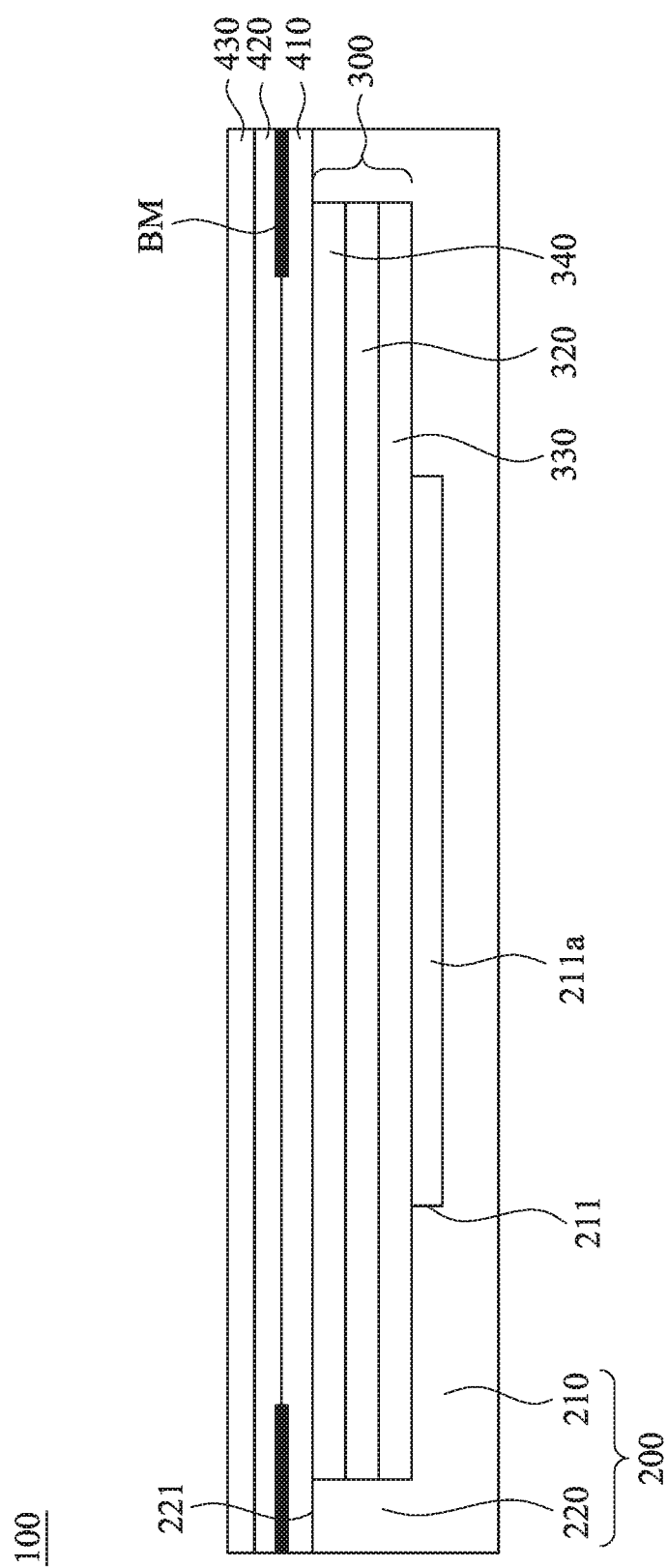
FIG. 1 is a schematic side view showing a touch display module in accordance with a first embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

Figure 2:
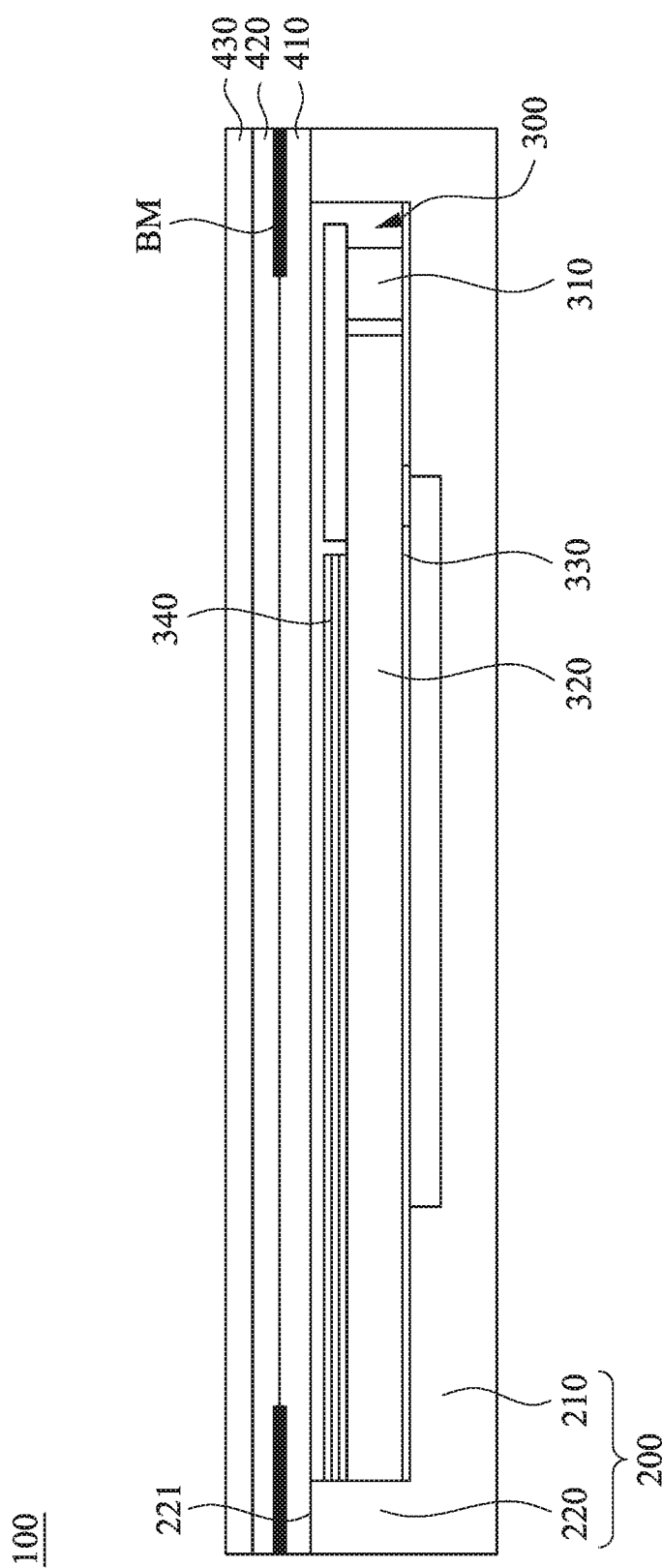
FIG. 2 is another schematic side view showing the touch display module in accordance with the first embodiment of the present disclosure.

Simultaneously referring to FIG. 1 and FIG. 2, FIG. 1 and FIG. 2 are different schematic side views showing a touch display module 100 in accordance with a first embodiment of the present disclosure. The touch display module 100 of the present embodiment mainly includes an integrated frame 200, a backlight module 300, a thin film transistor substrate 410, a color filter 420, and a polarizer 430. The integrated frame 200 has a bottom plate portion 210 and a side plate portion 220, and the side plate portion 220 stands on the bottom plate portion 210. The backlight module 300 is disposed on the bottom plate portion 210 and is located in a space which is surrounded by the side plate portion 220. As shown in FIG. 2, the backlight module 300 mainly includes a light source 310, a light guide plate 320, a reflecting film 330, and optical films 340. The light source 310 is disposed adjacent to a side of the light guide plate 320, the reflecting film 330 is disposed under the light guide plate 320, and the optical films 340 are disposed above the light guide plate 320. Therefore, light generated by the light source 310 can enter the light guide plate 320 from the side of the light guide plate 320 and exit from a front surface of the light guide plate 320. Moreover, the reflecting film 330 is configured to reflect the light emitted from a bottom surface of the light guide plate 320 back to the light guide plate 320, and the optical films 340 are configured to uniformize the light emitted from the light guide plate 320. In some examples, the light source 310 can be a light-emitting diode (LED) bar, and the light source 310 can be fixed in the integrated frame 200 by using a double-sided tape or through a positioning mechanism which is disposed on the bottom plate portion 210 of the integrated frame 200. It is noted that the backlight module 300 of the present embodiment does not have an iron shell of the conventional backlight module for combining with other frames, so the weight of the overall touch display module 100 can be reduced.

As shown in FIG. 1 and FIG. 2, the thin film transistor substrate 410 is disposed on the backlight module 300. The color filter 420 is disposed on the thin film transistor substrate 410. The polarizer 430 is disposed on the color filter 420. One surface of the polarizer 430 is used as an outer surface of the touch display module 100 of the present embodiment. In other words, the touch display module 100 of the present embodiment does not have a cover glass that is commonly used in a conventional touch display module, but instead directly uses the surface of the polarizer 430 as an operation surface for users, so the overall thickness of the touch display module 100 can be reduced. Because the touch display module 100 of the present embodiment omits the use of the cover glass, the polarizer 430 of the present embodiment can be treated by a hardening process so as to improve its hardness and scratch resistance, thereby protecting the components under the polarizer 430. In one example, Perfluoropolyethers (PFPE) can be used for the surface treatment of the polarizer 430.

Referring to FIG. 1 and FIG. 2, in the present embodiment, the backlight module 300 is located in a space which is surrounded by the side plate portion 220 of the integrated frame 200, and the thin film transistor substrate 410, the color filter 420, and the polarizer 430 are carried on a top surface 221 of the side plate portion 220. In the present embodiment, the thin film transistor substrate 410 is directly connected to the top surface 221 of the side plate portion 220 of the integrated frame 200. In some examples, the thin film transistor substrate 410 is attached to the color filter 420 by using adhesives, the color filter 420 is attached to the polarizer 430 by using adhesives, and the thin film transistor substrate 410 is attached to the top surface 221 of the side plate portion 220 by using adhesives. Due to the structural design of the integrated frame 200, the backlight module 300, the thin film transistor substrate 410, the color filter 420, and the polarizer 430 can be integrated into one single integrated frame 200, thereby reducing the overall thickness and weight of the touch display module 100. In addition, the hardened polarizer 430 has a function of protecting the backlight module 300, the thin film transistor substrate 410, and the color filter 420.

In the present embodiment, a black matrix layer BM is disposed between the color filter 420 and the thin film transistor substrate 410 to block light leakage from edges of each film structure. In one example, the black matrix layer BM can be a black ink layer which is formed on an edge portion of the bottom surface of the color filter 420 by printing. After the black matrix layer BM is formed, an adhesive can be coated on the bottom surface of the color filter 420 as well as the black matrix layer BM so as to make the adhesive be completely distributed on the bottom surface of the color filter 420. In other examples, the black matrix layer BM can be disposed on an upper surface of the color filter 420 or a bottom surface of the thin film transistor substrate 410, thereby achieving the same light blocking effect. As shown in FIG. 1, in some embodiments, the bottom plate portion 210 of the integrated frame 200 has a recessed portion 211, and the recessed portion 211 is configured to accommodate a buffer 211a. The buffer 211a is mainly used to support the films (such as the thin film transistor substrate 410, the color filter 420, and the polarizer 430) inside the integrated frame 200 to ensure that the light can be uniformly mixed by the films.

Figure 3:
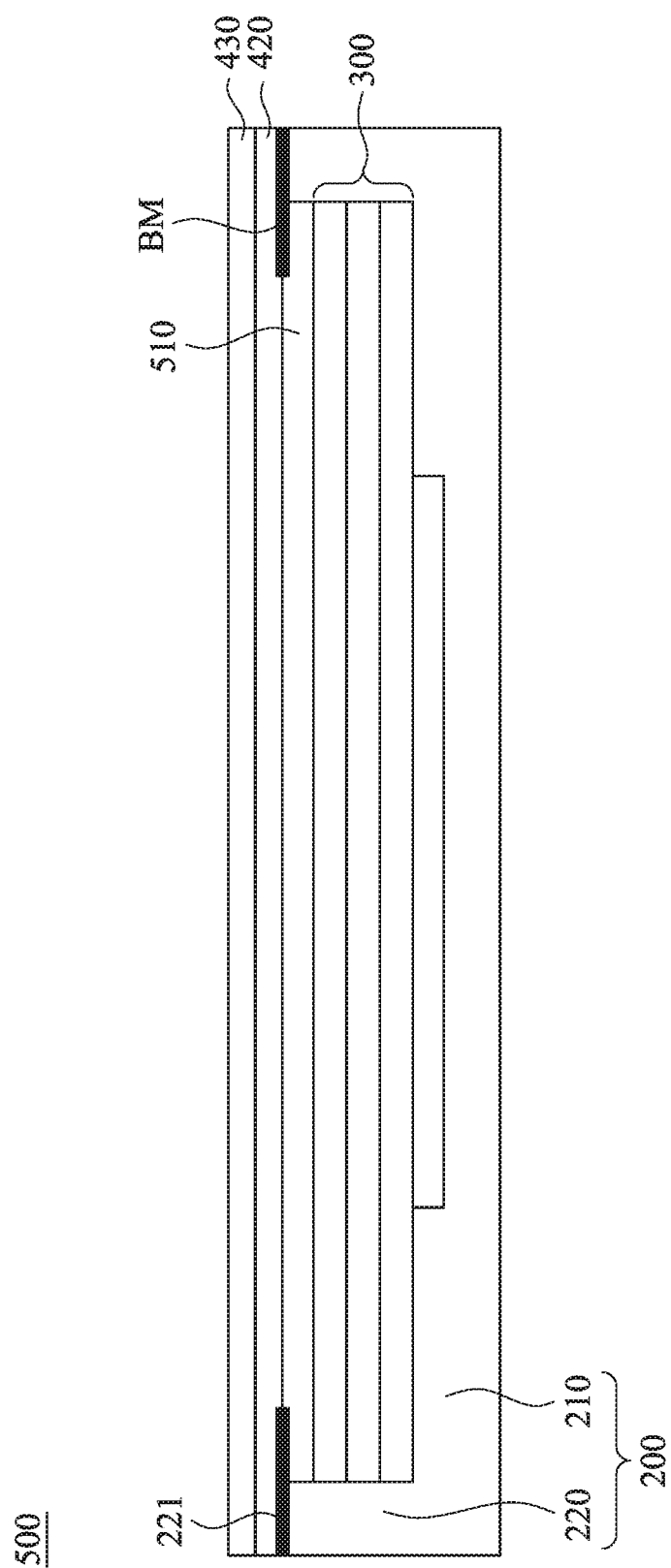
FIG. 3 is a schematic side view showing a touch display module in accordance with a second embodiment of the present disclosure.

In the present disclosure, the thin film transistor substrate and the color filter can be disposed on the integrated frame in different ways. Referring to FIG. 3, FIG. 3 is a schematic side view showing a touch display module 500 in accordance with a second embodiment of the present disclosure. The structure of the touch display module 500 of the present embodiment is similar to that of the touch display module 100 shown in FIG. 1, and the main difference therebetween is that both a thin film transistor substrate 510 and the backlight module 300 of the touch display module 500 are disposed in a space which is surrounded by the side plate portion 220 of the integrated frame 200. As shown in FIG. 3, a size of the thin film transistor substrate 510 of the touch display module 500 is smaller than a size of the color filter 420 and a size of the polarizer 430, so that the thin film transistor substrate 510 can be disposed together with the backlight module 300 in the space which is surrounded by the side plate portion 220 of the integrated frame 200. In addition, the color filter 420 and the polarizer 430 are carried on the top surface 221 of the side plate portion 220. In the present embodiment, the color filter 420 is directly connected to the top surface 221 of the side plate portion 220 of the integrated frame 200. Therefore, due to the structural design of the integrated frame 200, the backlight module 300, the thin film transistor substrate 510, the color filter 420, and the polarizer 430 can be integrated into the same integrated frame 200. In the present embodiment, the black matrix layer BM is disposed on the bottom surface of the color filter 420, and black matrix layer BM is used to block the light leakage from the edge of the backlight module 300. In other examples, the black matrix layer BM can be disposed between the color filter 420 and the polarizer 430, thereby achieving the same light blocking effect.

Figure 4:
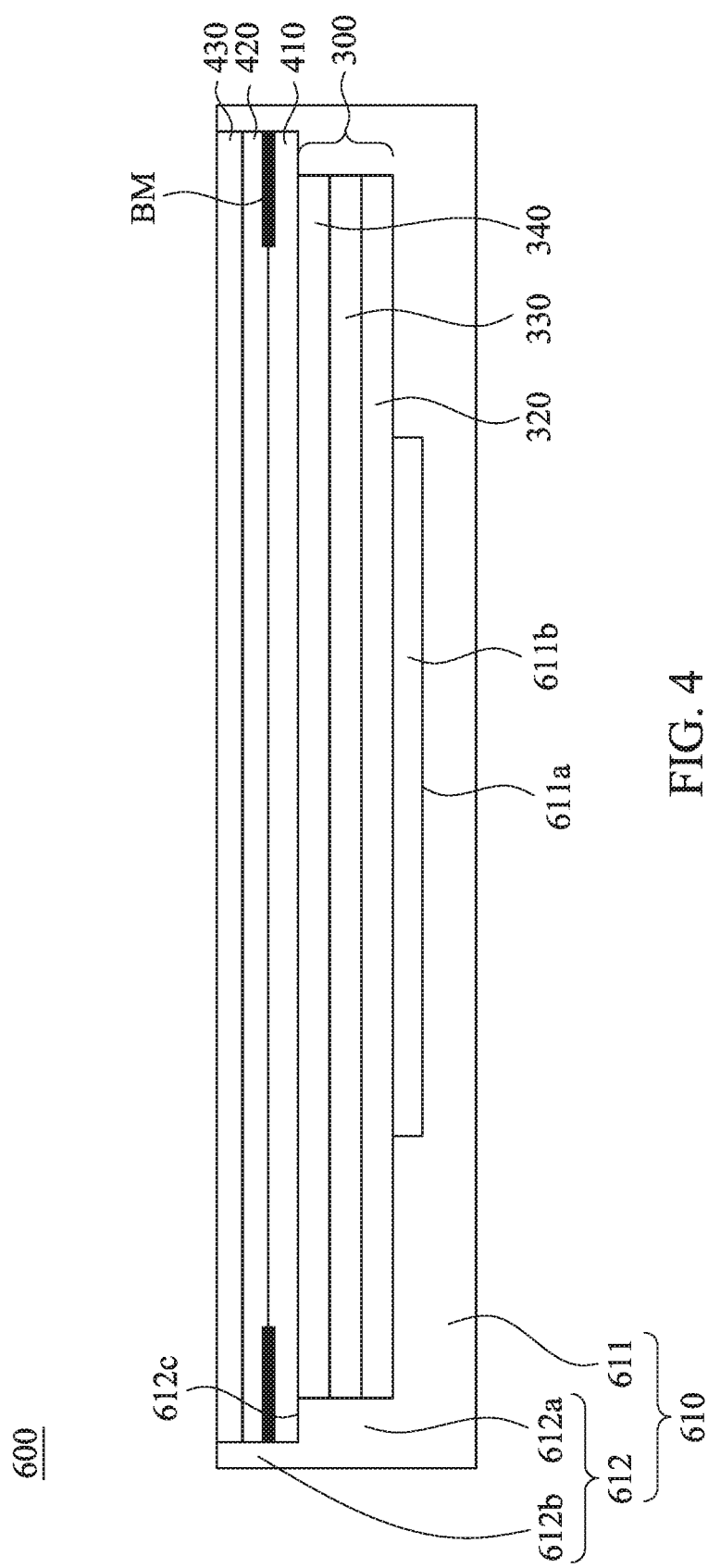
FIG. 4 is a schematic side view showing a touch display module in accordance with a third embodiment of the present disclosure.

In the present disclosure, the integrated frame has different designs. Referring to FIG. 4, FIG. 4 is a schematic side view showing a touch display module 600 in accordance with a third embodiment of the present disclosure. The structure of the touch display module 600 of the present embodiment is similar to that of the touch display module 100 shown in FIG. 1, and the main difference therebetween is that an integrated frame 610 of the touch display module 600 has a different design. As shown in FIG. 4, the integrated frame 610 includes a bottom plate portion 611 and a side plate portion 612, in which the side plate portion 612 has a first step portion 612a and a second step portion 612b, and the second step portion 612b is higher than the first step portion 612a. The backlight module 300 is located in a space which is surrounded by the first step portion 612a. The thin film transistor substrate 410, the color filter 420, and the polarizer 430 are carried on a top surface 612c of the first step portion 612a and are located in a space which is surrounded by the second step portion 612b. As shown in FIG. 4, the thin film transistor substrate 410 is directly connected to the top surface 612c of the first step portion 612a. Therefore, due to the structural design of the integrated frame 610, the backlight module 300, the thin film transistor substrate 410, the color filter 420, and the polarizer 430 can be integrated into one single integrated frame 610. Moreover, the hardened polarizer 430 can protect the backlight module 300, the thin film transistor substrate 410, and the color filter 420. In the present embodiment, the black matrix layer BM is disposed between the color filter 420 and the thin film transistor substrate 410, and black matrix layer BM is used to block the light leakage from the edge of the backlight module 300. In other examples, the black matrix layer BM can be disposed between the color filter 420 and the polarizer 430 or on the bottom surface of the thin film transistor substrate 410, thereby achieving the same light blocking effect. In some embodiments, the bottom plate portion 611 of the integrated frame 610 has a recessed portion 611a, and the recessed portion 611a is configured to accommodate a buffer 611b which is mainly used to support the films inside the integrated frame 610 to ensure that the light can be uniformly mixed by the films.

Figure 5:
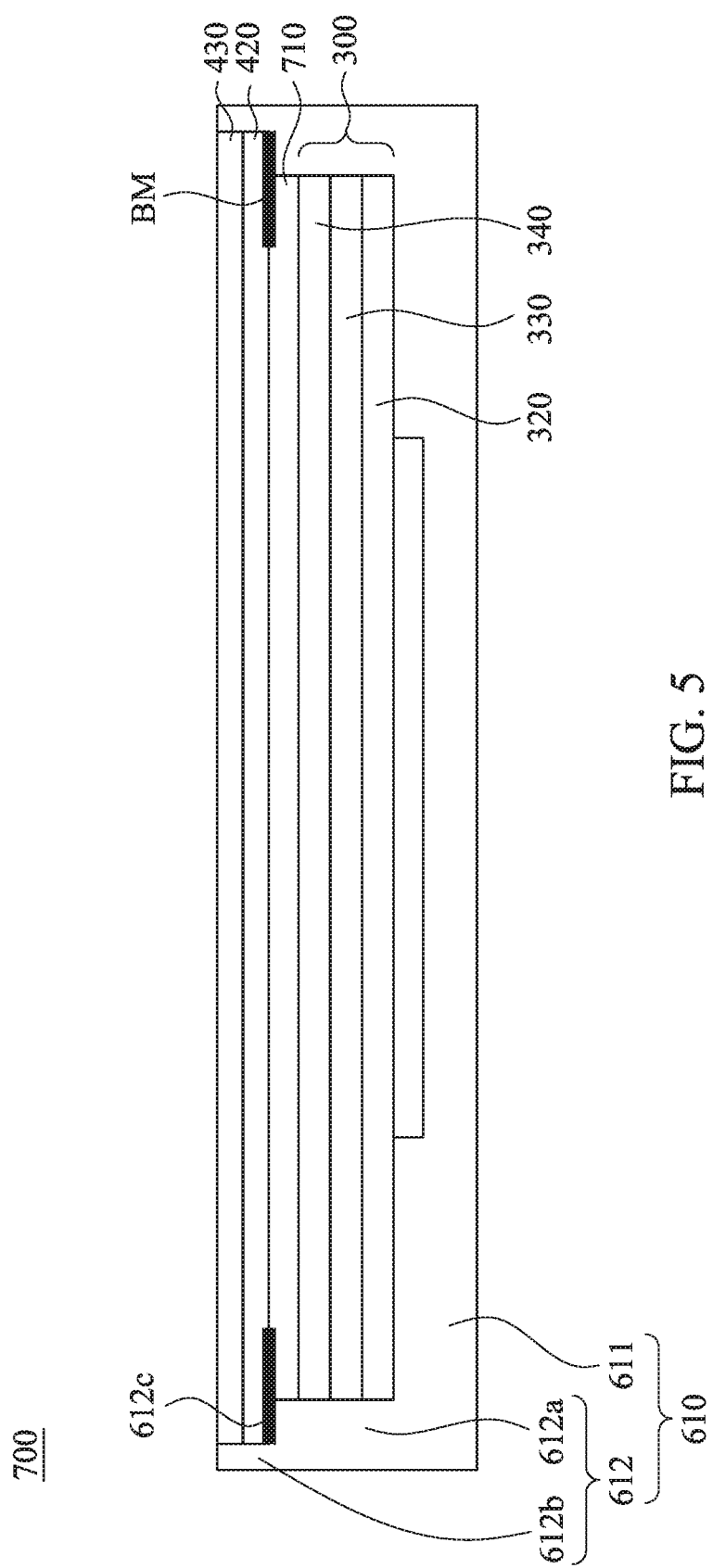
FIG. 5 is a schematic side view showing a touch display module in accordance with a fourth embodiment of the present disclosure.

Referring to FIG. 5, FIG. 5 is a schematic side view showing a touch display module 700 in accordance with a fourth embodiment of the present disclosure. The structure of the touch display module 700 of the present embodiment is similar to that of the touch display module 600 shown in FIG. 4, and the main difference therebetween is that a thin film transistor substrate 710 of the touch display module 700 is disposed together with the backlight module 300 in the space which is surrounded by the first step portion 612a of the side plate portion 612 of the integrated frame 610. As shown in FIG. 5, a size of the thin film transistor substrate 710 in the touch display module 700 is smaller than sizes of the color filter 420 and the polarizer 430, such that the thin film transistor substrate 710 can be disposed together with the backlight module 300 in the space which is surrounded by the first step portion 612a of the integrated frame 610. In addition, the color filter 420 and the polarizer 430 are located in the space which is surrounded by the second step portion 612b. In the present embodiment, the color filter 420 is directly connected to the top surface 612c of the first step portion 612a of the integrated frame 610. Therefore, due to the structural design of the integrated frame 610, the backlight module 300, the thin film transistor substrate 710, the color filter 420, and the polarizer 430 can be integrated into the same integrated frame 610. In the present embodiment, the black matrix layer BM is disposed on the bottom surface of the color filter 420, and black matrix layer BM is used to block the light leakage from the edge of the backlight module 300. In other examples, the black matrix layer BM can be disposed between the color filter 420 and the polarizer 430, thereby achieving the same light blocking effect.

Figure 6:
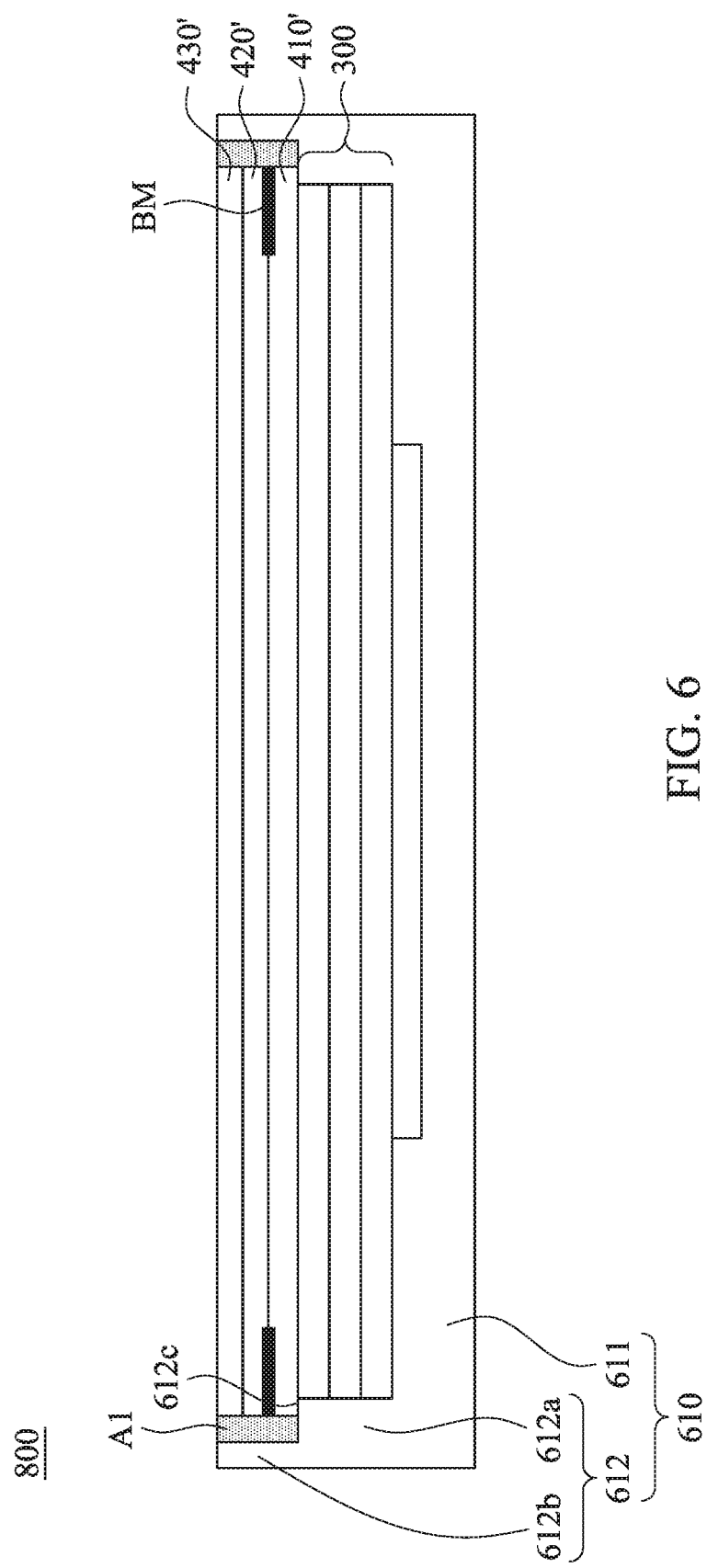
FIG. 6 is a schematic side view showing a touch display module in accordance with a fifth embodiment of the present disclosure.

It is noted that, in the embodiment of FIG. 4, the sizes of the thin film transistor substrate 410, the color filter 420, and the polarizer 430 which are enclosed by the second step portion 612b are fit to the size of the space which is surrounded by the second step portion 612b, thereby enabling the side edges of the thin film transistor substrate 410, the color filter 420, and the polarizer 430 to be directly abutted against an inner sidewall of the second step portion 612b. When the thin film transistor substrate, the color filter, and the polarizer are small in size and cannot be directly connected to the inner sidewall of the second step portion, a filling adhesive can be used to adhere the thin film transistor substrate, the color filter, and the polarizer to the inner sidewall of the second step portion. Referring to FIG. 6, FIG. 6 is a schematic side view showing a touch display module 800 in accordance with a fifth embodiment of the present disclosure. In the embodiment of FIG. 6, the structure of the touch display module 800 of the present embodiment is similar to that of the touch display module 600 shown in FIG. 4, and the main difference therebetween is that side edges of a thin film transistor substrate 410', a color filter 420', and a polarizer 430' of the touch display module 800 are connected to the inner sidewall of the second step portion 612b by a filling adhesive A1. As shown in FIG. 6, the thin film transistor substrate 410', the color filter 420', and the polarizer 430' are located in the space which is surrounded by the second step portion 612b of the side plate portion 612 of the integrated frame 610. Moreover, the thin film transistor substrate 410', the color filter 420', and the polarizer 430' are carried on the top surface 612c of the first step portion 612a, and the side edges of the thin film transistor substrate 410', the color filter 420', and the polarizer 430' are connected to the inner sidewall of the second step portion 612b by the filling adhesive A1. In the present embodiment, the black matrix layer BM is disposed on a bottom portion of the color filter 420' near an outer edge, and the black matrix layer BM is used to block the light leakage from the edge of the backlight module 300. In other examples, the black matrix layer BM can be disposed between the color filter 420' and the polarizer 430' or disposed on the bottom surface of the thin film transistor substrate 410', thereby achieving the same light blocking effect.

Figure 7:
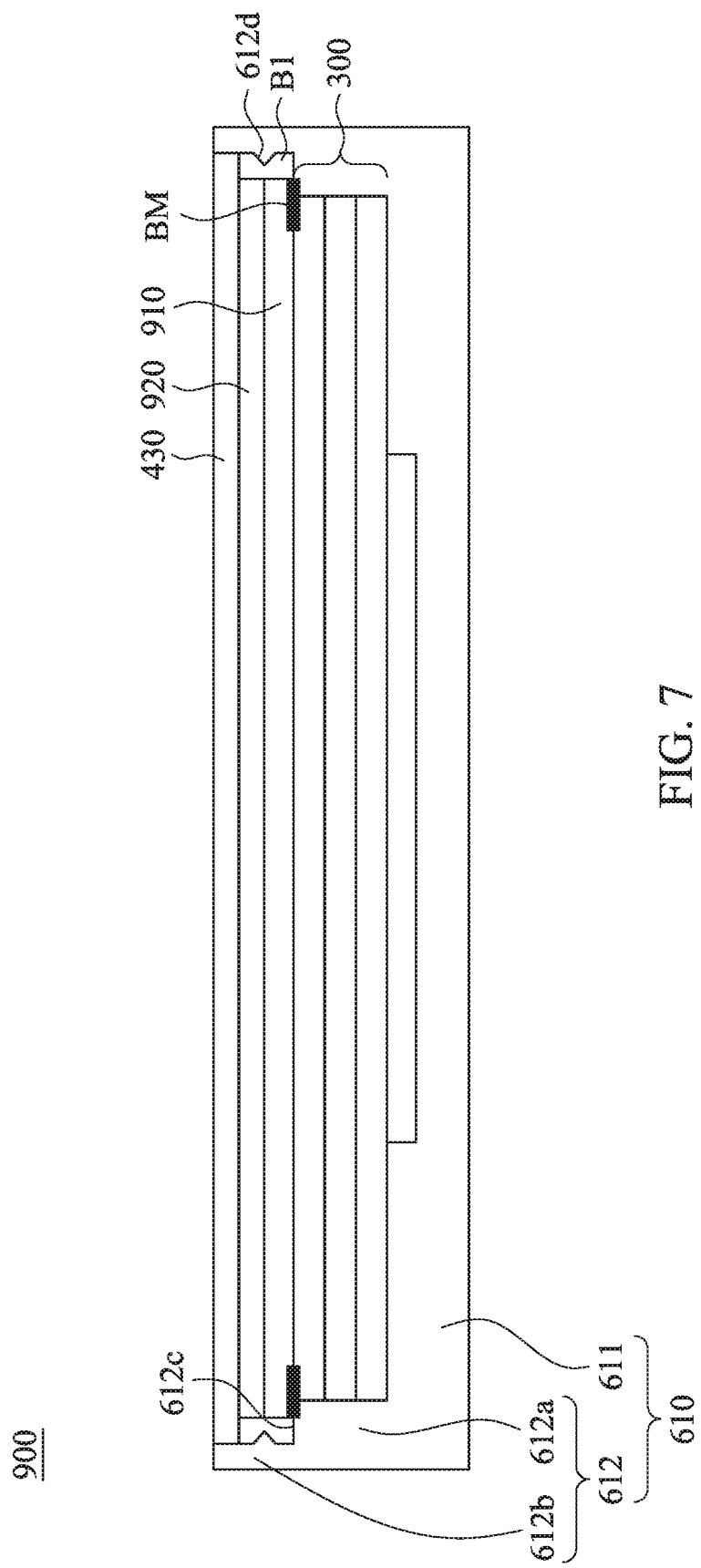
FIG. 7 is a schematic side view showing a touch display module in accordance with a sixth embodiment of the present disclosure.

Referring to FIG. 7, FIG. 7 is a schematic side view showing a touch display module 900 in accordance with a sixth embodiment of the present disclosure. The structure of the touch display module 900 in FIG. 7 is similar to that of the touch display module 600 shown in FIG. 4, and the main difference therebetween is that a thin film transistor substrate 910 and a color filter 920 of the touch display module 900 are engaged on the integrated frame 610 by a ring-shaped engaging member B1. In the touch display module 900, the thin film transistor substrate 910, the color filter 920, and the polarizer 430 are located in the space which is surrounded by the second step portion 612b of the side plate portion 612 of the integrated frame 610 and are carried on the top surface 612c of the first step portion 612a, in which a size of the thin film transistor substrate 910 and a size of the color filter 920 are smaller than the size of the polarizer 430. The ring-shaped engaging member B1 is put around the outer side edges of the thin film transistor substrate 910 and the color filter 920, and the ring-shaped engaging member B1 is engaged with an engaging mechanism 612d which is disposed on an inner sidewall of the second step portion 612b. The outer side edge of the polarizer 430 is directly abutted against the inner sidewall of the second step portion 612b.

In an assembly process of the touch display module 900, the backlight module 300 is first put into the integrated frame 610. Thereafter, the thin film transistor substrate 910, the color filter 920, and the polarizer 430 are attached to each other, and then the ring-shaped fastener B1 is put around the outer edges of the thin film transistor substrate 910 and the color filter 920. Then, the assembly of the thin film transistor substrate 910, the color filter 920, and the polarizer 430 is disposed into the integrated frame 610, so that the thin film transistor substrate 910 and the color filter 920 can be engaged on the inner sidewall of the second step portion 612b through the ring-shaped engaging member B1, and the outer edge of polarizer 430 is abutted against the inner sidewall of second step portion 612b. In the present embodiment, the black matrix layer BM is disposed on a bottom surface of the thin film transistor substrate 910 to block the light leakage from the edge of the backlight module 300. In other examples, the black matrix layer BM can be disposed between the color filter 920 and the polarizer 430 or disposed between the color filter 920 and the thin film transistor substrate 910, thereby achieving the same light blocking effect.

In the present disclosure, the aforementioned touch display module, such as the touch display module 100, the touch display module 500, the touch display module 600, the touch display module 700, the touch display module 800, or the touch display module 900, is an in-cell touch panel, and sensors of the touch display modules are disposed on the upper surface or the bottom surface of the color filter, or the upper surface or the bottom surface of the thin film transistor substrate, or the bottom surface of the polarizer.

As can be seen from the abovementioned embodiments of the present disclosure, the touch display module of the present disclosure mainly uses the integrated frame to integrate the backlight module, thin film transistor substrate, color filter, and polarizer into one single mechanical component, so that the touch display module of the present disclosure does not need a cover glass which is used by a conventional touch display module. Moreover, the backlight module in the touch display module of the present disclosure also does not need to use an iron shell, thereby reducing the overall weight and thickness of the touch display module.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the invention. In view of the foregoing, it is intended that the present disclosure cover modifications and variations of this disclosure provided they fall within the scope of the following claims.

What is claimed is:

1. A touch display module comprising a plurality of sensors, wherein the touch display module comprises:
   an integrated frame having a bottom plate portion and a side plate portion, wherein the side plate portion stands on the bottom plate portion;
   a backlight module disposed on the bottom plate portion, wherein the backlight module is located in a space which is surrounded by the side plate portion;
   a thin film transistor substrate disposed on the backlight module;
   a color filter disposed on the thin film transistor substrate; and
   a polarizer disposed on the color filter, wherein:
      a surface of the polarizer is an outer surface of the touch display module,
      at least one of the thin film transistor substrate or the color filter is connected to the side plate portion of the integrated frame, and
      the color filter and the polarizer overlie a top surface of the side plate portion and are carried on the top surface of the side plate portion.

2. The touch display module of claim 1, wherein:
   the thin film transistor substrate overlies the top surface of the side plate portion and is carried on the top surface of the side plate portion.

3. The touch display module of claim 1, wherein:
   the thin film transistor substrate is located in the space which is surrounded by the side plate portion.

4. The touch display module of claim 1, further comprising a black matrix layer, wherein the black matrix layer is disposed between the polarizer and the color filter, between the color filter and the thin film transistor substrate, or on a bottom surface of the thin film transistor substrate.

5. The touch display module of claim 1, wherein:
   the bottom plate portion of the integrated frame has a recessed portion, and
   a buffer is disposed in the recessed portion.

6. The touch display module of claim 1, wherein the surface of the polarizer is a hardened surface.

7. The touch display module of claim 1, wherein the sensors are disposed on an upper surface or a bottom surface of the color filter, or disposed on an upper surface or a bottom surface of the thin film transistor substrate, or disposed on a bottom surface of the polarizer.

8. The touch display module of claim 1, wherein the backlight module comprises a reflective film, a light guide plate disposed on the reflective film, and one or more optical films disposed on the light guide plate.

9. The touch display module of claim 8, wherein:
   the bottom plate portion of the integrated frame has a recessed portion,
   a buffer is disposed in the recessed portion, and
   the reflective film is disposed on the buffer.

10. The touch display module of claim 1, wherein:
    the backlight module comprises a reflective film, and
    a buffer is disposed between the bottom plate portion and the reflective film.

11. The touch display module of claim 1, wherein a sidewall of the side plate portion is co-planar with a sidewall of at least one of the color filter or the polarizer.

12. The touch display module of claim 1, wherein a sidewall of the side plate portion is co-planar with a sidewall of the color filter and a sidewall of the polarizer.

13. The touch display module of claim 1, wherein the backlight module comprises a light source and a light guide plate adjacent the light source.

14. The touch display module of claim 1, wherein the thin film transistor substrate is in contact with a sidewall of the side plate portion.

15. A touch display module comprising a plurality of sensors, wherein the touch display module comprises:
   an integrated frame having a bottom plate portion and a side plate portion, wherein:
      the side plate portion stands on the bottom plate portion,
      the side plate portion has a first step portion and a second step portion, and
      the second step portion is higher than the first step portion;
   a backlight module disposed on the bottom plate portion, wherein the backlight module is located in a space which is surrounded by the first step portion;
   a thin film transistor substrate disposed on the backlight module;
   a color filter disposed on the thin film transistor substrate; and
   a polarizer disposed on the color filter, wherein:
      a surface of the polarizer is an outer surface of the touch display module,
      at least one of the thin film transistor substrate or the color filter is connected to the side plate portion of the integrated frame, and
      the color filter and the polarizer overlie a top surface of the first step portion, are carried on the top surface of the first step portion, and are located in a space which is surrounded by the second step portion.

16. The touch display module of claim 15, wherein outer side edges of the thin film transistor substrate, the color filter, and the polarizer are connected to an inner sidewall of the second step portion by a filling adhesive.

17. The touch display module of claim 15, wherein:
   outer side edges of the thin film transistor substrate and the color filter are set with a ring-shaped engaging member,
   the ring-shaped engaging member is engaged with an engaging mechanism which is disposed on an inner sidewall of the second step portion, and
   an outer side edge of the polarizer is directly abutted against the inner sidewall of the second step portion.

18. A touch display module comprising a plurality of sensors, wherein the touch display module comprises:
   an integrated frame having a bottom plate portion and a side plate portion, wherein:
      the side plate portion stands on the bottom plate portion, and
      the bottom plate portion of the integrated frame has a recessed portion;
   a buffer disposed in the recessed portion,
   a backlight module disposed on the bottom plate portion over the buffer;
   a thin film transistor substrate disposed on the backlight module;
   a color filter disposed on the thin film transistor substrate; and
   a polarizer disposed on the color filter, wherein:
      a surface of the polarizer is an outer surface of the touch display module, and
      at least one of the thin film transistor substrate or the color filter is connected to the side plate portion of the integrated frame.

19. The touch display module of claim 18, wherein the bottom plate portion contacts a bottom surface of the backlight module.

20. The touch display module of claim 18, wherein the backlight module comprises a reflective film, a light guide plate disposed on the reflective film, and one or more optical films disposed on the light guide plate.

* * * * *